US007547997B1

(12) United States Patent
Simunek et al.

(10) Patent No.: US 7,547,997 B1
(45) Date of Patent: Jun. 16, 2009

(54) AIRCRAFT ELECTRICAL SERVICING ADAPTER

(75) Inventors: William W. Simunek, Forked River, NJ (US); Stephen F. Peta, Havertown, PA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 26 days.

(21) Appl. No.: 11/973,975

(22) Filed: Sep. 28, 2007

(51) Int. Cl.
*G01R 1/20* (2006.01)

(52) U.S. Cl. ...................................................... 307/154

(58) Field of Classification Search .................. 307/154
See application file for complete search history.

(56) References Cited

U.S. PATENT DOCUMENTS

RE39,036 E * 3/2006 Castleman .................. 323/283

* cited by examiner

*Primary Examiner*—Robert L. Deberadinis
(74) *Attorney, Agent, or Firm*—Dave A. Ghatt

(57) ABSTRACT

A system for enabling the use of one electrical servicing cable having a 115V/400 Hz AC cablehead, to supply aircrafts having either a three-phase 115V/400 Hz AC electrical power system, or a 270 VDC/28 VDC electrical power system, for aircraft pre-flight and maintenance operations. The system includes a controller for determining and controlling the supply of appropriate power to an aircraft. The system includes an aircraft electrical servicing adapter that facilitates the safe supply of power to a 270 VDC aircraft via the 115V/400 Hz AC cablehead.

17 Claims, 5 Drawing Sheets

AIRCRAFT ELECTRICAL SERVICING ADAPTER

STATEMENT OF GOVERNMENT INTEREST

The following description was made in the performance of official duties by employees of the Department of the Navy, and, thus the claimed invention may be manufactured, used, licensed by or for the United States Government for governmental purposes without the payment of any royalties thereon.

TECHNICAL FIELD

The following description relates generally to an apparatus for enabling the use of one electrical servicing cable for supplying aircrafts having a three-phase 115V/400 Hz AC power system, or aircrafts having a 270 VDC electrical power system, to enable proper pre-flight and maintenance operations.

BACKGROUND

Aircrafts require pre-flight and maintenance electrical servicing. When an aircraft is parked on the ground or on an aircraft carrier or the like, power is typically supplied via an electrical cable assembly. The cable assembly typically includes a power source attached at one cable end, and the other end is free to be attached to a power receptacle on the body of the aircraft. Different aircrafts employ different types of electrical power systems, and therefore there is a compatibility requirement for the electrical cable assemblies and the aircraft power receptacles.

Traditionally, most of the aircrafts deployed on US Navy ships have a 115 VAC/400 Hz AC, electrical power system. In order to perform maintenance and pre-flight operations, aircrafts are outfitted with an external power receptacle, typically a six pole NATO standard per MS90362. The existing Aircraft Electrical Servicing System (AESS) aboard US Navy ships provide electrical power to embarked aircraft by way of a portable servicing cable assembly with a plug that fits the MS90362 receptacle. Next generation aircrafts like the F-35 Joint Strike Fighter (JSF) have a 270 VDC electrical power system and have a 270 VDC external power receptacle. As a result, any ship or airport that will receive the JSF will need to provide 270 VDC electrical power for maintenance and pre-flight operations.

The introduction of JSFs in addition to the traditional aircraft will have a significant cost, infrastructure, size and weight impacts to the carrier ships, if a plurality of power systems are to be provided on each carrier ship. Thus, it is desired to provide a single power system that is compatible with both the 115 VAC/400 Hz AC and the 270V DC systems. It is also desired to have a power supply system that is relatively inexpensive and that does not require a significant change in infrastructure.

SUMMARY

In one aspect, the invention is an aircraft electrical servicing adapter for use with a power supply system and an aircraft. According to the invention, the power supply system includes a controller, a 28 VDC power source, a 270 VDC power source, and a 115V/400 Hz AC power source, a 115V/400 Hz cablehead plug, and a first power recognition circuit segment. The aircraft is equipped to receive power from a 270 VDC power source and a 28 VDC power source, the aircraft having a 270 VDC receptacle. In this aspect, the aircraft electrical servicing adapter comprises an adapter body, a power end attached to the adapter body, an aircraft end attached to the adapter body, and a second power recognition circuit segment having a diode. In this aspect, the second power recognition circuit segment is provided for completing a single power recognition circuit with the first power recognition circuit segment. The aircraft electrical servicing adapter further includes a socket arrangement having six socket openings located in the aircraft end of the adaptor, for receiving 270 VDC receptacle pins of an aircraft. The adapter also has a receptacle arrangement having six pins, the receptacle arrangement located on the power end of the adaptor for mating with the 115V/400 Hz AC cablehead plug of the power supply arrangement. In this aspect, the receptacle arrangement comprises a two part pin having a first contact portion and a second contact portion, with the first and second contact portions forming at least a portion of the first power recognition circuit segment with the diode connected across the contacts. In this aspect, when the receptacle arrangement is inserted into the 115V/400 Hz AC cablehead plug the single power recognition circuit is completed and communicates to the controller that the adapter is attached to the cablehead. This results in the controller supplying power from the 28 VDC power source and the 270 VDC power source to the cablehead.

In another aspect, the invention is a system for supplying power to different types of aircraft. In this aspect, the system includes one or more aircrafts. Each of the one or more aircrafts is equipped to receive power from a 115V/400 Hz AC power source, a 270 VDC power source and a 28 VDC power source. In this aspect, the invention includes a power supply system, the power supply system comprising a controller, a 28 VDC power source, a 270 VDC power source, and a 115V/400 Hz AC power source. The power supply system also includes a 115V/400 Hz AC cablehead plug, and a first power recognition circuit segment for forming a single power recognition circuit with either a second power recognition circuit segment or a third power recognition segment. In this aspect, the invention includes an aircraft electrical servicing adapter. The aircraft electrical servicing adapter comprises an adapter body, a power end attached to the adapter body, and an aircraft end attached to the adapter body. The aircraft electrical servicing adapter further includes a second power recognition circuit segment having a diode, and a socket arrangement having six socket openings located in the aircraft end of the adaptor for receiving 270 VDC receptacle pins of an aircraft. Additionally, the adapter further includes a receptacle arrangement having six pins, with the receptacle arrangement located on the power end of the adaptor for mating with the 115V/400 Hz AC cablehead plug of the power supply arrangement.

BRIEF DESCRIPTION OF THE DRAWINGS

Other features will be apparent from the description, the drawings, and the claims.

DETAILED DESCRIPTION

Figure 1:
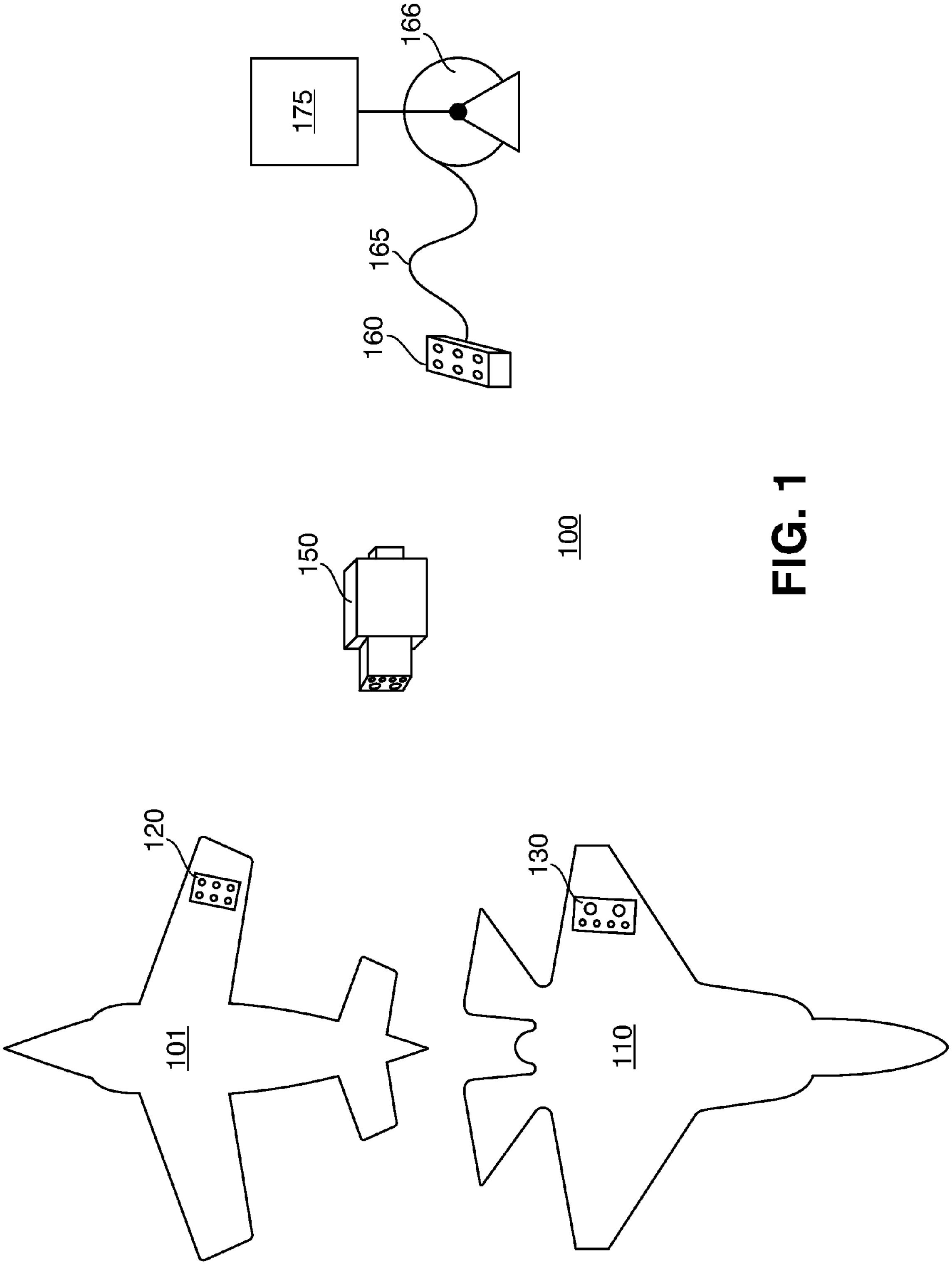
FIG. 1 is an exemplary illustration of a system for powering a plurality of aircraft types, according to an embodiment of the invention.

FIG. 1 is an exemplary illustration of a system 100 for powering a plurality of aircraft types, according to an embodiment of the invention. The system 100 may be located on an aircraft carrier, or alternatively be located on a land-based airport or hanger, for providing pre-flight and/or general electrical servicing. As shown, the system 100 includes an aircraft electrical servicing adapter 150, a cablehead 160, and a cable 165, which is wound on a cable storage device 166, such as a spool. The cable 165 is attached to a power supply 175.

FIG. 1 shows aircrafts 101 and 110. Aircraft 101 includes a standard six pole 115 VAC/400 Hz AC external power receptacle 120. Aircraft 110 has a 270 VDC power receptacle. The cablehead 160 includes a socket that is structured to mate with the standard six pole external power receptacle 120, allowing power from power source 175 to be supplied to an aircraft such as 101, which includes the standard receptacle 120. However the structure of cablehead 160 does not allow direct mating with 270 VDC power receptacles 130 as included on aircrafts such as 110. According to the present invention, the cablehead 160 may be connected to the 270 VDC power receptacle via the aircraft electrical servicing adaptor 150, which is compatible with both the cablehead and the 270 VDC power receptacle. Although FIG. 1 shows two aircrafts, the illustrated aircrafts 101 and 110 merely represent the types of aircrafts for which the system is applicable. Thus, the system 100 may include more aircrafts or less aircrafts than depicted in FIG. 1. As will be outlined below, the system provides a safe and reliable means of ensuring that the correct type of power is applied to each type of aircraft.

Figure 2A:
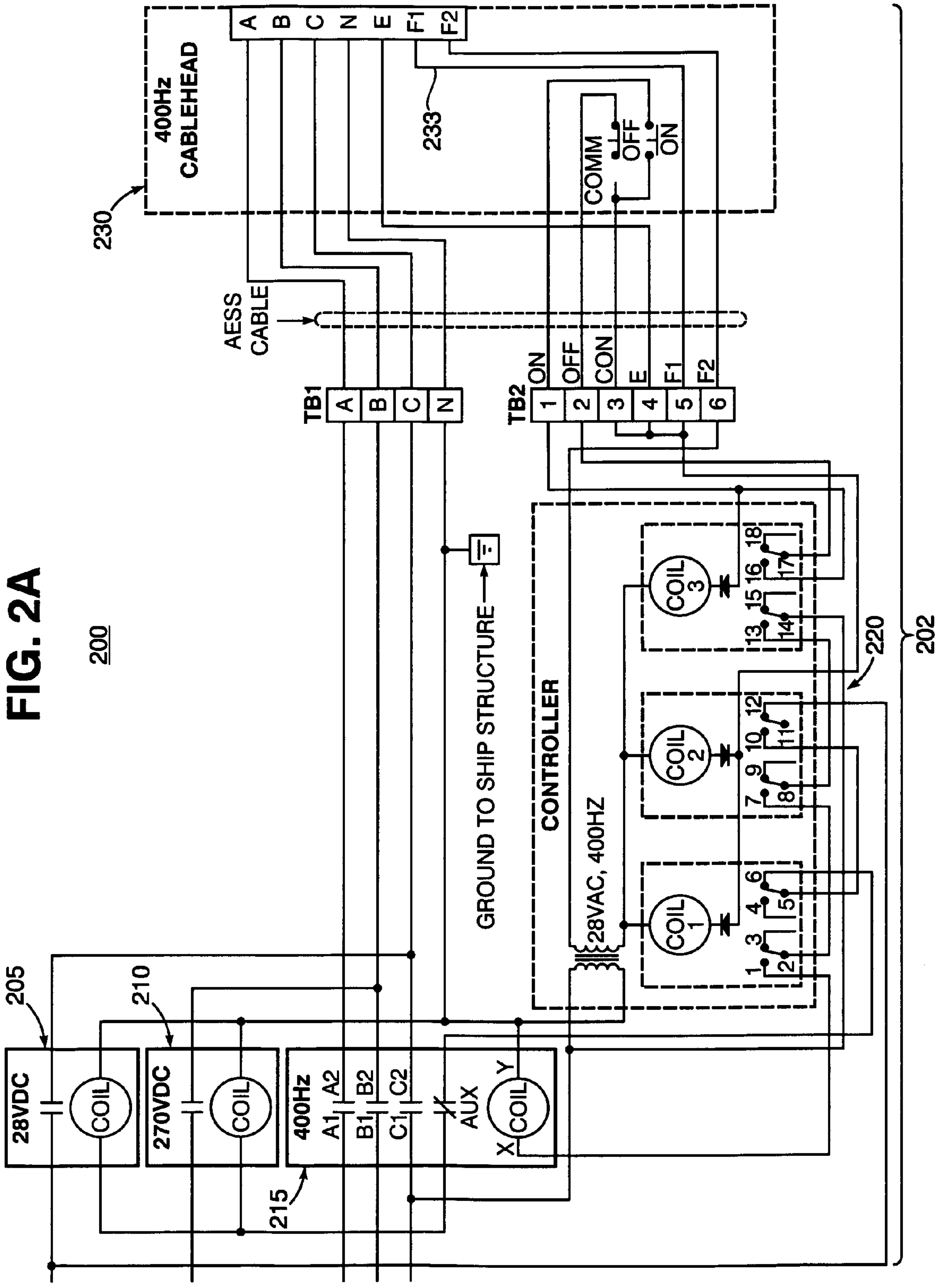
FIG. 2 is a schematic illustration of a system for powering a plurality of aircraft types, according to an embodiment of the invention.
Figure 2B:
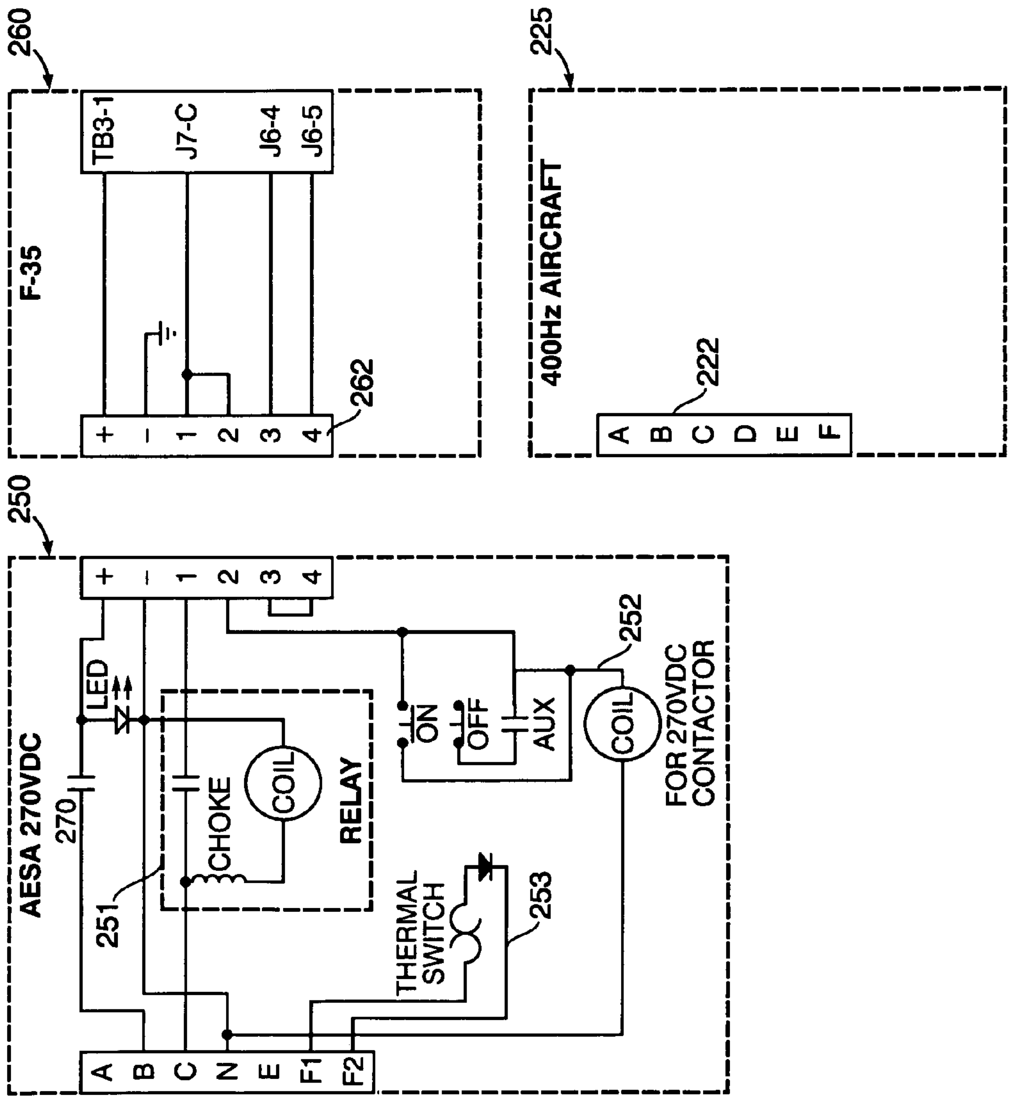

FIG. 2 is a schematic illustration of a system 200 for powering a plurality of aircraft types, according to an embodiment of the invention. FIG. 2 shows a system 200 having a power supply system 202. The power supply system 202 includes power sources 205, 210, and 215. Power source 205 provides a 28 VDC power supply, power source 210 provides a 270 VDC power supply, and power source 215 provides a 115 VAC/400 Hz AC power supply. The power supply system 202 also includes a power supply controller 220 for controlling the operation of the supply system 202, as well as the operation of the overall system 200. FIG. 2 also shows cablehead 230.

FIG. 2 further illustrates an aircraft electrical servicing adapter 250 and an aircraft 260 having an external power receptacle 262, a 270 VDC receptacle which is situated on an aircraft such as 110 shown in FIG. 1. As shown in FIG. 2, and as outlined above, the physical structure of the cablehead 230 is incompatible with the external power receptacle 262. However, as shown, connection between the abovementioned elements may be achieved via the adapter 250.

Figure 3A:
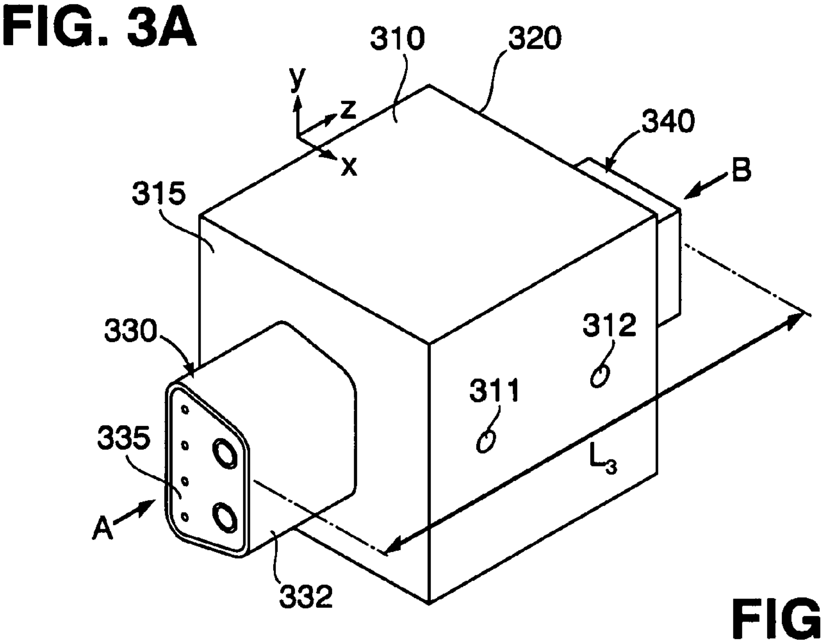
FIG. 3A is an exemplary illustration of an aircraft electrical servicing adapter, according to an embodiment of the invention.

FIGS. 3A-3D are exemplary illustrations of the aircraft electrical servicing adapter 250, according to an embodiment of the invention. As shown in FIG. 3A, the adapter 250 includes an adapter body 310, which primarily includes the adapter circuitry (shown in FIG. 2) including ON and OFF buttons 311 and 312 respectively. The adapter 250 may also include an adapter controller for controlling the operation of the adapter. As shown, the adapter body 310 may be rectangular. However the body 310 may be of any desired shape. FIG. 3A shows the adapter body 310 having a back face 315 and a front face 320, with an aircraft end 330 of the adapter attached to the back face 315 and a power end 340 of the adapter attached to the front face 320.

Figure 3B:
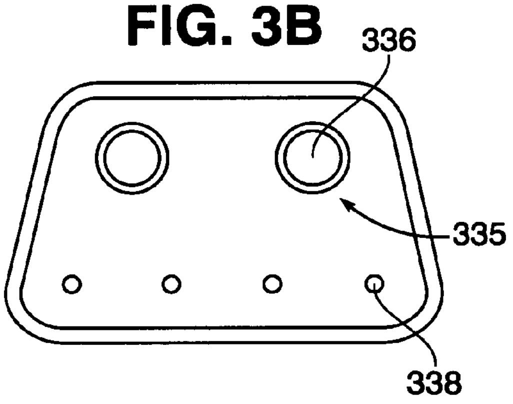
FIG. 3B is a perspective illustration of a socket arrangement as viewed from arrow A in FIG. 3A.

The aircraft end 330 of the adapter comprises a cable 332 which may comprise an elastomeric material. As shown in FIGS. 3A and 3B, the aircraft end 330 includes a socket arrangement 335 having six socket openings (336, 338). The socket openings are arranged in two rows, a first row having two socket openings 336 and a second row having four socket openings 338. As shown, the two socket openings 336 of the first row are larger than the four socket openings 338 of the second row. The socket arrangement 335 represents a mating arrangement for physically mating with a 270 VDC receptacle of an aircraft.

Figure 3C:
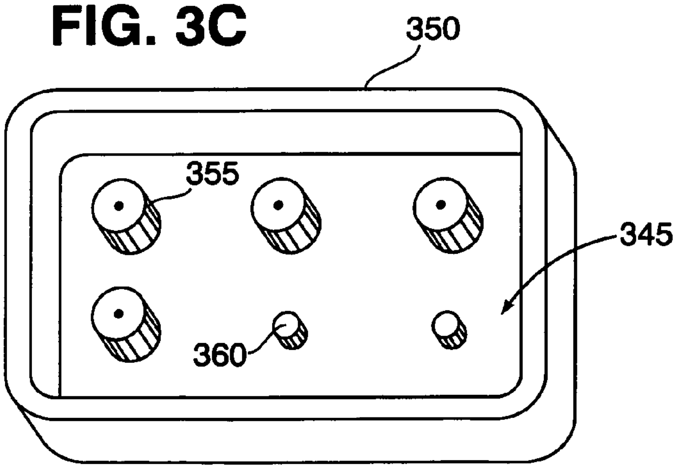
FIG. 3C is a perspective illustration of a receptacle arrangement as viewed from arrow B in FIG. 3A.
Figure 3D:
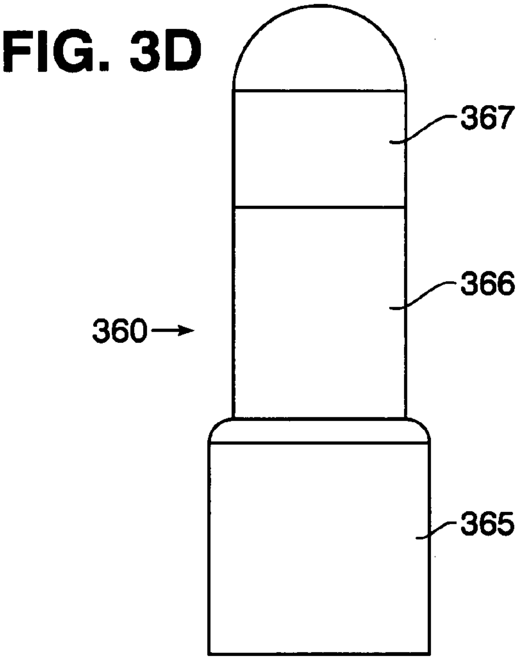
FIG. 3D is an exemplary illustration of a two-part pin according to an embodiment of the invention.

As shown in FIGS. 3A and 3C, the power end 340 of the adapter comprises a six-pin receptacle arrangement 345 surrounded by a protective shield 350. The six-pin arrangement includes a first row having three pins 355, and a second row having three pins. The second row includes a two-part F pin 360 having two separate contacts or conducting portions. FIG. 3D shows the structure of the two-part F pin 360. The pin 360 includes a lower portion 365 comprising a conducting material. The pin 360 also includes an upper portion comprising two separate regions, a first region comprising insulating material shown at 366 and a second region comprising conducting material shown at 367. As shown, the region comprising the insulating material is sandwiched between the conducting material of the lower portion and the conducting material of the upper portion. Additionally, the lower portion 365 has a larger diameter than the upper portion (366, 367). This structure allows the two-part F pin 360 to have two separate contact points when the cablehead is inserted thereon, thereby forming and closing a power recognition circuit, as outlined below.

Figure 3E:
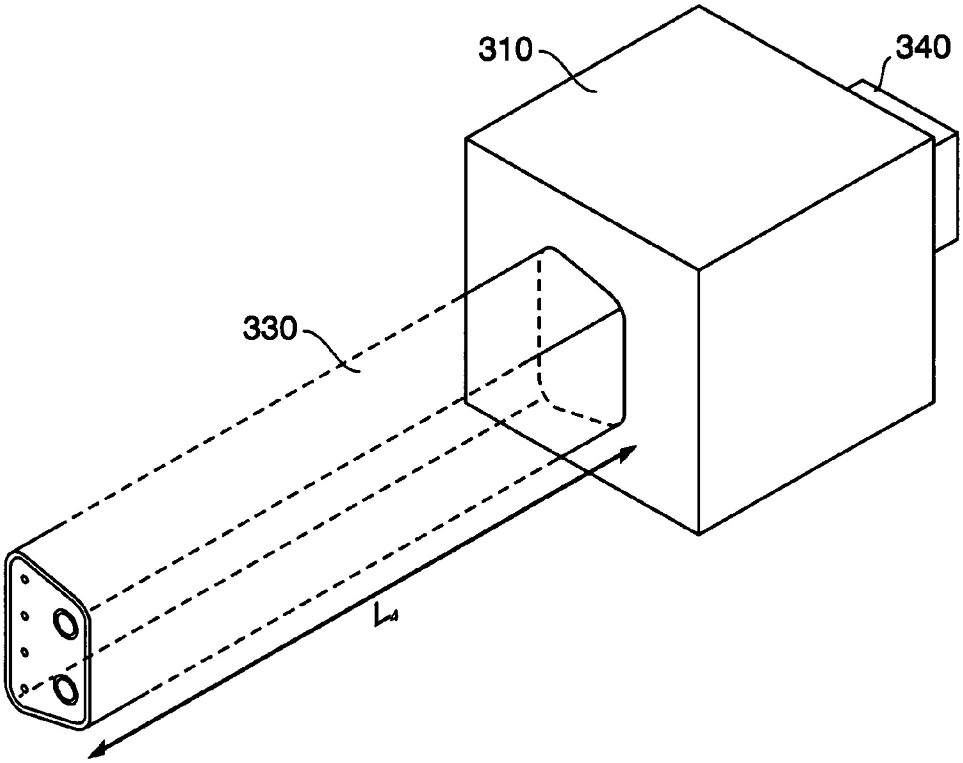
FIG. 3E is an exemplary illustration of an aircraft electrical servicing adapter having an elongated cable, according to an embodiment of the invention.

FIG. 3A shows a length in the z-direction, $L_3$, measuring the length of the adapter 250 from the aircraft end to the power end. In order to have a compact apparatus, $L_3$ is about 8 inches to about 14 inches, preferably from about 9 inches to about 12 inches in length. According to an embodiment of the invention, the adapter body may have a length in the z-direction of about 3 inches to about 5 inches. The shield at the power end may be about 1 inch to about 2 inches in the z-direction, and the cable at the aircraft end may be about 3 inches to about 6 inches in the z-direction. Additionally, the adapter may also have a thickness (x-direction) of about 3 inches to about 6 inches, and a height (y-direction) of about 3 inches to about 5 inches. In another embodiment shown in FIG. 3E, the cable at the airplane end may have a length $L_4$ of about 10 ft to about 40 ft to facilitate the attachment of the adapter to an airplane via the airplane receptacle.

In operation, if an aircraft having a 270 VDC receptacle is to be connected to the power supply system 202, the aircraft electrical servicing adapter 250 must be an intermediary between the components. According to this embodiment, with reference to FIGS. 2, 3A, 3B, 3C, and 3D, the adapter 250 is connected at the adapter's power end 340 to the cablehead 230 of the power supply system 202. As shown in FIG. 3C, the power end 340 includes a receptacle arrangement having six pins including the two-part pin 360. See also FIG. 3D. When the cablehead 230 and the adapter 250 make a proper electrical connection, a power recognition circuit is completed. As shown in FIG. 2, the power recognition circuit comprises a first power recognition circuit segment 233 located within the power supply system 202, and a second power recognition circuit segment 253 in the adapter 250. The first power recognition circuit segment may include a power supply independent of supplies 205, 210, and 215. The second power recognition circuit segment, illustrated in FIG. 2, includes contacts $F_1$ and $F_2$ of the two-part contact, and a diode connected across the contacts. When the single power recognition is completed between the first and second segments, the diode allows current to flow in only one direction. This unidirectional current flow communicates to the controller 220 that the adapter 250 is connected to the power supply system 202. In response to this information, the controller 220 closes the coils in the 28 VDC power source 205 and the 270 VDC power source 210, allowing the supply of power from the aforementioned sources to the adapter 250, and preventing the supply of potentially damaging power from the 115 VAC/400 Hz AC power source 215.

As shown in FIG. 2, the adapter 250 includes a first relay 251 and a second relay, contactor 252, as well as an electrical switch for switching ON and OFF the current flow through the second relay 252. When the power from sources 205 and 210 are supplied to the adapter 250, the current from the 28 VDC supply 205 is allowed to flow through the adapter via the first relay 251. As a safety measure, the 270 VDC current is prevented from automatically flowing through the adapter 250. The 270 VDC current is only allowed through the adapter 250 if the electrical switch is turned ON.

After the current from the 28 VDC supply 205 is allowed to flow through the adapter 250, the current flows through to the aircraft 260 via the receptacle 262, if the aircraft is electrically connected to the adapter 250. If the aircraft is electrically connected to the adapter 250, the 28 VDC current flows through to the aircraft and back towards the adapter. FIG. 2 shows the current flowing from pin I and jumping back to the adapter via pin 2. When this current flows back to the adapter, it flows towards the ON/OFF switch, thereby energizing the switch and allowing a user to close the switch (into the ON position). In the ON position, current from the 270 VDC source is allowed to flow through the second relay through the adapter to the aircraft, thereby fully powering the aircraft. This arrangement where the switch 253 can only be turned ON if the 28 VDC current first flows to an electrically connected aircraft, protects a user from the hazardous effects of a 270 VDC power surge when the adapter is not connected to an aircraft. In other words, according to this arrangement, the 270 VDC power is only supplied through the adapter if an aircraft is properly attached to the adapter. It should be noted that if there is some sort of system error, and the 115 VAC/400 Hz supply is applied to the adapter 250, the relays 251 and 252 would not allow the alternating current to flow through the adapter 250, thereby preventing potential hazard to a user or to a connected 270 VDC aircraft. FIG. 2 also shows a thermal switch within the second power recognition circuit segment, which protects against overheating in the adapter.

It should be noted that an aircraft 275 having a 115 VAC/400 Hz six pin receptacle 277, as shown in FIG. 2, may be connected directly to the power supply system 202 via the complementarily mating cablehead 230 and aircraft receptacle 277. In this arrangement, as opposed to a two-part F-pin 260, the aircraft receptacle includes a solid F-pin, similar to pin 355 shown in FIG. 3C. The solid F-pin showed schematically in FIG. 2, at least partially forms a third power recognition circuit segment. Together with the first power recognition circuit segment 233, the third segment forms a single power recognition circuit. When the solid F pin is inserted into the socket arrangement of the cablehead, the single power recognition circuit between the aircraft receptacle and the power supply system is completed. Because this arrangement does not include a diode, the current flow in the completed recognition circuit is not limited to one direction. The resulting bidirectional current flow signals to the power supply system controller 220 that a 400 Hz receptacle is attached to the cablehead 230, and that the 115 VAC/400 Hz AC power source is required. In response to this information, the controller 220 closes the coils in the 115 VAC/400 Hz power source 215, allowing only the supply of power from source 215 to the aircraft 275, and preventing the supply of potentially damaging power from the 28 VDC and 270 VDC power sources.

What has been described and illustrated herein are preferred embodiments of the invention along with some variations. The terms, descriptions and figures used herein are set forth by way of illustration only and are not meant as limitations. Those skilled in the art will recognize that many variations are possible within the spirit and scope of the invention, which is intended to be defined by the following claims and their equivalents, in which all terms are meant in their broadest reasonable sense unless otherwise indicated.

What is claimed is:

1. An aircraft electrical servicing adapter for use with a power supply system and an aircraft, the power supply system having a controller, a 28 VDC power source, a 270 VDC power source, and a 115V/400 Hz AC power source, a 115V/400 Hz cablehead plug, and a first power recognition circuit segment, and the aircraft equipped to receive power from a 270 VDC power source and a 28 VDC power source, the aircraft having a 270 VDC receptacle, the aircraft electrical servicing adapter comprising:

an adapter body;

a power end attached to the adapter body;

an aircraft end attached to the adapter body; and a second power recognition circuit segment having a diode, the second power recognition circuit segment for completing a single power recognition circuit with the first power recognition circuit segment;

a socket arrangement having six socket openings located in the aircraft end of the adaptor for receiving 270 VDC receptacle pins of an aircraft;

a receptacle arrangement having six pins, said receptacle arrangement located on the power end of the adaptor for mating with the 115V/400 Hz AC cablehead plug of the power supply arrangement, wherein the receptacle arrangement comprises:

a two part pin having a first contact portion and a second contact portion, said first and second contact portions forming at least a portion of the first power recognition circuit segment with the diode connected across the contacts, wherein when said receptacle arrangement is inserted into the 115V/400 Hz AC cablehead plug the single power recognition circuit is completed and communicates to the controller that the adapter is attached to the cablehead resulting in the controller supplying power from the 28 VDC power source and the 270 VDC power source to the cablehead.

2. The aircraft electrical servicing adapter of claim 1, the adapter further comprising:

a first relay having a first relay coil, a second relay having a second relay coil, and an electrical switch for switching ON and OFF the current flow through the second relay, wherein after the power from the 28 VDC and the 270 VDC power sources are supplied to the cablehead, the first relay coil closes and allows the 28 VDC power to be transmitted to the aircraft which feeds the power back to the adaptor, wherein the second relay coil is energized by the 28 VDC power supply allowing a user to turn the switch ON to allow the 270 VDC power to be transmitted through the adapter and to the aircraft.

3. The aircraft electrical servicing adapter of claim 2, the adapter body comprising a front face and a back face, the power end attached to the front face and the aircraft end attached to the back face, the aircraft end comprising a cable having the socket arrangement therein, and the power end having a shield surrounding the pins of the receptacle arrangement.

4. The aircraft electrical servicing adapter of claim 3, wherein in the receptacle arrangement, the six pins are arranged in a first row and a second row, each of the first and second rows having three pins, wherein the two-part pin is located in the second column, the two-part pin comprising a lower portion having a first diameter and an upper portion having a second diameter smaller than the first diameter, the lower portion comprising a conducting material, the upper portion comprising an insulating material and a conducting material, wherein the insulating material is sandwiched between the conducting material of the lower portion and the conducting material of the upper portion.

5. The aircraft electrical servicing adapter of claim 4, wherein the socket arrangement comprises:

a first row of openings having two of said six socket openings; and a second row of openings having four of said six socket openings, wherein said openings in said first row are larger than said openings in said second row.

6. The aircraft electrical servicing adapter of claim 5, wherein the length of the adaptor from the airplane end to the power end is about 9 inches to about 12 inches.

7. The aircraft electrical servicing adapter of claim 5, wherein the cable at the aircraft end has a length of about 12 feet to about 30 feet.

8. A system for supplying power to different types of aircraft, the system comprising:

one or more aircrafts, each of the one or more aircrafts equipped to receive power from a 115V/400 Hz AC power source, a 270 VDC power source, and a 28 VDC power source;

a power supply system comprising:

a controller;

a 28 VDC power source;

a 270 VDC power source;

a 115V/400 Hz AC power source;

a 115V/400 Hz AC cablehead plug; and a first power recognition circuit segment for forming a single power recognition circuit with either a second power recognition circuit segment or a third power recognition segment;

an aircraft electrical servicing adapter comprising:

an adapter body;

a power end attached to the adapter body;

an aircraft end attached to the adapter body; and a second power recognition circuit segment having a diode; and a socket arrangement having six socket openings located in the aircraft end of the adaptor for receiving 270 VDC receptacle pins of an aircraft; and a receptacle arrangement having six pins, said receptacle arrangement located on the power end of the adaptor for mating with the 115V/400 Hz AC cablehead plug of the power supply arrangement.

9. The system of claim 8, wherein the receptacle arrangement comprises:

a two part pin having a first contact portion and a second contact portion, said first and second contact portions forming at least a portion of the second power recognition circuit with the diode connected across the contacts, wherein when said receptacle arrangement is inserted into the 115V/400 Hz AC cablehead plug the single power recognition circuit is completed and communicates to the controller that the adapter is attached to the cablehead, wherein in response to said communication by the power recognition circuit, the controller initiates the supply of power from the 28 VDC power source and the 270 VDC power source to the cablehead.

10. The system of claim 9, wherein the one or more aircrafts is an aircraft equipped to receive power from a 270 VDC power source and a 28 VDC power source, and having a 270 VDC receptacle, the 270 VDC receptacle of the aircraft attached to the socket arrangement of the adapter, wherein the adapter further comprises:

a first relay having a first relay coil, a second relay having a second relay coil, and an electrical switch for switching ON and OFF the current flow through the second relay, wherein when the power from the 28 VDC and the 270 VDC power sources are supplied to the cablehead, the first relay coil closes and allows the 28 VDC power to be transmitted to the aircraft which feeds the power back to the adaptor, wherein the second relay coil is energized by the 28 VDC power supply allowing a user to turn the switch ON to allow the 270 VDC power to be transmitted through the adapter and to the aircraft.

11. The system of claim 10, the adapter body comprising a front face and a back face, the power end attached to the front face and the aircraft end attached to the back face, the aircraft end comprising a cable having the socket arrangement therein, and the power end having a shield surrounding the pins of the receptacle arrangement.

12. The system of claim 11, wherein in the receptacle arrangement, the six pins are arranged in a first row and a second row, each of the first and second rows having three pins, wherein the two-part pin is located in the second row, the two-part pin comprising a lower portion having a first diameter and an upper portion having a second diameter smaller than the first diameter, the lower portion comprising a conducting material, the upper portion comprising an insulating material and a conducting material, wherein the insulating material is sandwiched between the conducting material of the lower portion and the conducting material of the upper portion.

13. The system of claim 12, wherein the socket arrangement comprises:

a first row of openings having two of said six socket openings; and a second row of openings having four of said six socket openings, wherein said openings in said first row are larger than said openings in said second row.

14. The system of claim 13, wherein the length of the adaptor from the airplane end to the power end is about 9 inches to about 12 inches.

15. The system of claim 13, wherein the cable at the aircraft end has a length of about 12 feet to about 30 feet.

16. The system of claim 8, wherein the one or more aircrafts is a 400 Hz aircraft equipped to receive power from a 115V/400 Hz AC power source, having a 115V/400 Hz AC receptacle, the 115V/400 Hz AC receptacle of the aircraft attached to the 115V/400 Hz cablehead plug, wherein the 115V/400 Hz AC receptacle comprises a six pin arrangement, including a solid pin that is at least a part of the third power recognition circuit segment.

17. The system of claim 16, wherein when said receptacle arrangement is inserted into the 115V/400 Hz AC cable plug the single power recognition circuit is completed and communicates to the controller that a 400 Hz aircraft receptacle is attached to the cablehead, wherein in response to said communication by the single power recognition circuit, the controller initiates the supply of power from the 115V/400 Hz AC power source to the cablehead.

* * * * *